(12) United States Patent
Roy

(10) Patent No.: US 7,064,362 B2
(45) Date of Patent: Jun. 20, 2006

(54) PHOTODETECTOR OF AN IMAGE SENSOR

(75) Inventor: François Roy, Seyssins (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/658,215

(22) Filed: Sep. 9, 2003

(65) Prior Publication Data

US 2004/0046170 A1    Mar. 11, 2004

(30) Foreign Application Priority Data

Sep. 11, 2002    (FR) .................................. 02 11215

(51) Int. Cl.
*H01L 27/148*    (2006.01)
*H01L 29/04*    (2006.01)

(52) U.S. Cl. .......................... 257/225; 257/59; 257/72; 257/88; 257/232; 257/291; 257/292

(58) Field of Classification Search .................. 257/53, 257/225–234, 290–292, 59, 72, 79, 88; 438/48, 438/49, 54, 78, 79
See application file for complete search history.

(56) References Cited

U.S. PATENT DOCUMENTS

| | | | | |
|---|---|---|---|---|
| 5,163,179 A | * | 11/1992 | Pellegrini | 257/451 |
| 5,587,596 A | * | 12/1996 | Chi et al. | 257/223 |
| 5,614,744 A | * | 3/1997 | Merrill | 257/291 |
| 6,160,281 A | * | 12/2000 | Guidash | 257/292 |
| 6,392,279 B1 | * | 5/2002 | Toyofuku | 257/408 |
| 6,423,994 B1 | | 7/2002 | Guidash | |
| 6,512,544 B1 | * | 1/2003 | Merrill et al. | 348/302 |
| 6,563,101 B1 | * | 5/2003 | Tullis | 250/208.1 |
| 6,741,283 B1 | * | 5/2004 | Merrill et al. | 348/308 |
| 6,743,652 B1 | * | 6/2004 | Thomas et al. | 438/48 |
| 2003/0127672 A1 | * | 7/2003 | Rahn et al. | 257/291 |

OTHER PUBLICATIONS

French Search Report from French Patent Application No. 02/11215, filed Sep. 11, 2002.
Patent Abstracts of Japan, vol. 017, No. 646 (E-1467), Nov. 30, 1993 & JP 05 207376 A (Olympus Optical Col. Ltd.).

\* cited by examiner

*Primary Examiner*—Ori Nadav
(74) *Attorney, Agent, or Firm*—Lisa K. Jorgenson; James H. Morris; Wolf, Greenfield & Sacks, P.C.

(57) ABSTRACT

A photodetector formed in monolithic form including a first active area of doped single-crystal silicon corresponding to first and second photodiodes having the same surface area as two charge transfer MOS transistors, and as one storage diode; a second active area of doped single-crystal silicon arranged next to the portion of the first active area associated with the second photodiode and corresponding to a precharge switch; and a third active doped single-crystal silicon area arranged next to the portion of the first active area associated with the first photodiode and corresponding to two read MOS transistors in series, in which the surfaces of the second and third active areas exposed to light are substantially identical.

12 Claims, 3 Drawing Sheets

PHOTODETECTOR OF AN IMAGE SENSOR

BACKGROUND OF THE INVENTION

1. Field of the Invention

The present invention relates to a pixel photodetector, made in monolithic form, of an image sensor intended to be used in devices such as, for example, cameras, camcorders, digital microscopes or digital cameras.

2. Discussion of the Related Art

FIG. 1 schematically shows a pixel of a pixel matrix of an image sensor. Each pixel comprises a precharge device and a read device. The precharge device is formed of an N-channel MOS transistor M1, interposed between a supply rail Vdd and a read node I. The gate of precharge transistor M1 receives a precharge control signal Rs. The read device is formed of the series connection of two N-channel MOS transistors. The drain of a first one of these read transistors, hereafter, M2, is connected to supply rail Vdd. The source of second read transistor M3 is connected to input terminal P of an electronic processing circuit. The gate of first read transistor M2 is connected to read node I. The gate of second read transistor M3 receives a read signal Rd. The cathode of a charge storage diode D1 is connected to node I. The cathode of a photodiode D2 is connected to node I via an N-channel charge transfer MOS transistor M4, the gate of which receives a charge transfer control signal T. The anodes of diode D1 and of photodiode D2 are connected to a reference supply rail or ground of circuit GND.

The operation of this circuit is the following. A photodetection cycle starts with a precharge phase in which diode D1 is charged to a reference voltage level. This precharge is performed by turning on precharge transistor M1. Once the precharge has been performed, precharge transistor M1 is turned off. Then, the system is maintained as such, all transistors being off. The state at node I, that is, the real reference charge state of diode D1 is then read by turning on for a very short time second read transistor M3.

The cycle carries on with a transfer to node I of the photogenerated charges, that is, of the charges created and stored in the presence of radiation, in photodiode D2. This transfer is performed by turning on transfer transistor M4. Once the transfer is over, transistor M4 is turned off and photodiode D2 starts photogenerating and storing again charges which will be subsequently transferred to node I. After the transfer, the new charge state of diode D1 is read. The output signal transmitted to terminal P then depends on the pinching of the channel of first read transistor M2, which is a direct function of the charge stored in the photodiode. Once the reading is over, transistor M3 is turned off and the cycle starts again by a precharge of diode D1.

FIG. 2 shows an electric diagram of a practical implementation of a pixel of an image sensor.

In practice, another photodiode D3 is assembled in parallel with photodiode D2. The anode of photodiode D3 is connected to ground GND. The cathode of photodiode D3 is connected to node I via a MOS transistor M5, the gate of which is controlled by a transfer signal T'.

The steps of the previously-described read process are then alternately carried out for photodiodes D2 and D3.

Such an electric diagram thus consists of connecting in common, for two photodiodes D2, D3 of two pixels, read transistors M2, M3 and precharge transistor M1. Such a structure is called a 2.5T pixel since it comprises 5 MOS transistors for two photodiodes D2, D3, that is, "2.5 transistors" per photodiode.

FIG. 3 schematically shows a conventional example of topology of a 2.5T pixel in which the electric circuit of FIG. 2 is formed by a technology with one polysilicon level and three metallization levels. Other polysilicon and metallization levels may be present and used.

The surfaces delimited by a thin line correspond to active semiconductor substrate areas, to single-crystal silicon strips deposited on the substrate and corresponding to the gates of MOS transistors, or to metal strips of level 1 or 2. The dotted lines indicate portions of polysilicon strips deposited under metal strip portions or portions of active areas arranged under polysilicon strips or metal strips. Although the view is not shown to scale, the relative dimensions of each region are kept to show the real bulk of the integrated circuit. The crosses represent contacts connecting, through the insulating layers located between the metallization levels, metal strips to active areas or to polysilicon strips or vias connecting, through insulating layers located between the metallization levels, metal strips or other metal strips.

An active area 10 corresponds to photodiodes D2, D3, to transfer transistors M4, M5, and to storage diode D1. Active area 10 may be formed according to a LOCOS technology. Reference 12 represents a field insulation area, for example, made of silicon oxide which delimits active area 10.

Gate GM4 of MOS transistor M4 corresponds to a portion of a polysilicon strip 14. Gate GM5 of MOS transistor M5 corresponds to a portion of a polysilicon strip 16. Photodiode D2 is formed in the portion of active area 10 under gate GM4. Photodiode D3 is formed in the portion of active area 10 above gate GM5. Storage diode D1 is formed between polysilicon strips 14, 16. An active area 18 corresponds to precharge MOS transistor M1. An active area 20 corresponds to the first and second read MOS transistors M2, M3. Gate GM1 of MOS transistor M1 corresponds to a portion of a polysilicon strip 22. Gate GM2 of MOS transistor M2 corresponds to a portion of a polysilicon strip 24. Gate GM3 of read MOS transistor M3 corresponds to a portion of a polysilicon strip 26 which conducts read signal Rd. A metal strip 28 of level 1 is connected to source SM1 of MOS transistor M1, to polysilicon strip 24, and to active area 10 between polysilicon strips 14, 16. A metal strip 30 of level 1 is connected to polysilicon strip 22 and conducts precharge control signal Rs. A metal strip 32 of level 1, partly covering polysilicon strip 26, plays a role similar to the role of metal strip 30 for the row adjacent to the row associated to the 2.5T pixel shown in FIG. 3 and located thereunder. Drains DM1, DM2 of MOS transistors M1, M2 are connected to a metal strip 33 of level 3 at supply voltage Vdd. Source SM3 of MOS transistor M3 is connected to a metal strip of level 2 connected to the electronic processing system (not shown), only one metal portion 34 of level 1 being shown. Metal strips of levels 1 and 2 (not shown in FIG. 3) substantially superposed to polysilicon strips 14, 16 carry charge transfer signals T, T' and are regularly connected to said polysilicon strips 14, 16 to compensate for the polysilicon resistance and ensure that all pixels in a line receive signals T, T' at the same time.

FIG. 4 shows a partial simplified cross-section of the pixel of FIG. 3 along line III—III. The pixel is formed in a substrate 36 of a first heavily-doped conductivity type, for example, type P (P+). Active area 10 corresponds to a well 37 of the same conductivity type as substrate 36, but more lightly doped. A heavily-doped drain region 38 of the opposite conductivity type, for example, type N (N+), extends between the two gates GM4, GM5 of MOS transistors M4, M5. To the right of gate GM4 of MOS transistor M4 and to the left of gate GM5 of MOS transistor M5 are located source regions 39, 40 of the opposite conductivity type. Source regions 39, 40 are formed on a much larger surface area than drain region 38 and form with underlying well 37 the junctions of photodiodes D2, D3. Heavily-doped P-type regions (P+) 41, 42 are connected to the reference voltage or to ground via well 37 and substrate 36. Each photodiode D2, D3 is of the so-called fully depleted type and comprises, at the surface of source region 39, 40, a very heavily-doped shallow P-type region 43, 44. Regions 43, 44 are in contact with regions 41, 42, and are thus permanently maintained at the level of the reference voltage.

A first insulating layer 45 covers the previously-described structure. Level-1 metal strip 28 is connected to drain region 38 by a contact 47. A second insulating layer 49 covers first insulating layer 45 and metal strips 28, 30, 32 of the first metallization level. Two metal strips 50, 51 of level 2 extend in substantially parallel fashion to polysilicon strips 14, 16.

Insulating layers 45, 49 are formed of a transparent insulating material so that the light rays can reach photodiodes D2, D3. The photon absorption results at the level of photodiodes D2, D3 in the releasing of electrons which are stored in N-type regions 39, 40. The photon absorption at the level of the portions exposed to light of active areas 18, and of polysilicon strips 22, 24, 26 may also cause in these elements the release of electrons which tend to diffuse towards region 39, 40 of the closest photodiode D2, D3 and to take part in the charge of photodiode D2, D3. In particular, electrons originating from active area 20 and from polysilicon strips 24, 26 tend to mainly diffuse towards photodiode D2, while electrons originating from active area 18 and from polysilicon strip 22 tend to mainly diffuse towards photodiode D3. Given that the exposed surfaces of active areas 18, 20 are different, and that the exposed surfaces of polysilicon strips 22, 24, 26 are also different, an uneven electron diffusion towards photodiodes D2, D3 is obtained for a same light exposure. This results in a different charge stored in photodiodes D2, D3 for a same light exposure. Different voltages are then obtained upon transfer of the charges of photodiodes D2, D3.

At the level of the electronic processing system, such a difference translates as a fixed noise. This very disturbing defect can be partly corrected by using different amplification gains for the electronic processing of the signals originating from photodiodes D2 or D3. However, such a selective correction is difficult to implement over all the amplitudes of the signals likely to be obtained.

Another possibility consists of masking active areas 18, 20 and polysilicon strips 22, 24, 26 which are not to be exposed to light with a metal layer of a metallization level greater than level 2. However, this implies forming an additional metallization level and results in parasitic capacitive couplings between the added metal and the metal strips of other metallization levels. Further, the efficiency of the obtained masking may be imperfect, given the remoteness of the metal mask and of the photodiodes.

SUMMARY OF THE INVENTION

The present invention aims at obtaining a pixel of 2.5T type which does not exhibit at least the previously-mentioned disadvantage.

To achieve this and other objects, the present invention provides a photodetector formed in monolithic form comprising a first active area of doped single-crystal silicon corresponding to first and second photodiodes having the same surface area, as two charge transfer MOS transistors, and as one storage diode, the cathode of each photodiode being connected to the cathode of the storage diode via one of the charge transfer MOS transistors; a second active area of doped single-crystal silicon arranged next to the portion of the first active area associated with the second photodiode and corresponding to a precharge switch, having a first terminal connected to the cathode of the storage diode and a second terminal connected to a reference voltage; and a third active doped single-crystal silicon area arranged next to the portion of the first active area associated with the first photodiode and corresponding to two read MOS transistors in series, the gate of one of the read transistors being connected to the cathode of the storage diode and the drain or the source of one of the read transistors being connected to a processing system, in which the surfaces of the second and third active areas exposed to light are substantially identical.

According to an embodiment of the present invention, the second and third active areas have substantially identical surface areas.

According to an embodiment of the present invention, the first, second, and third active areas are rectangular, the second and third active areas being of same dimensions and substantially aligned at a same distance from a side of the first active area.

According to an embodiment of the present invention, the precharge switch is a MOS transistor with two parallel gates.

According to an embodiment of the present invention, the gates of the two read transistors correspond to portions of first and second polysilicon strips and the two gates of the MOS transistors with two gates correspond to portions of third and fourth parallel polysilicon strips, the sum of the surface areas exposed to light of the third and fourth parallel polysilicon strips being substantially equal to the sum of the surface areas exposed to light of the first and second polysilicon strips.

According to an embodiment of the present invention, a fifth polysilicon strip, perpendicular to the third and fourth parallel polysilicon strips, connects the third and fourth parallel strips.

According to an embodiment of the present invention, the photodetector comprises a metal strip connected to the fifth polysilicon strip, said metal strip comprising an extension partially covering the second polysilicon strip.

According to an embodiment of the present invention, the gates of the charge transfer MOS transistors correspond to portions of polysilicon strips which extend between the second and third active areas.

The foregoing object, features and advantages of the present invention, will be discussed in detail in the following non-limiting description of specific embodiments in connection with the accompanying drawings.

DETAILED DESCRIPTION

Figure 1:
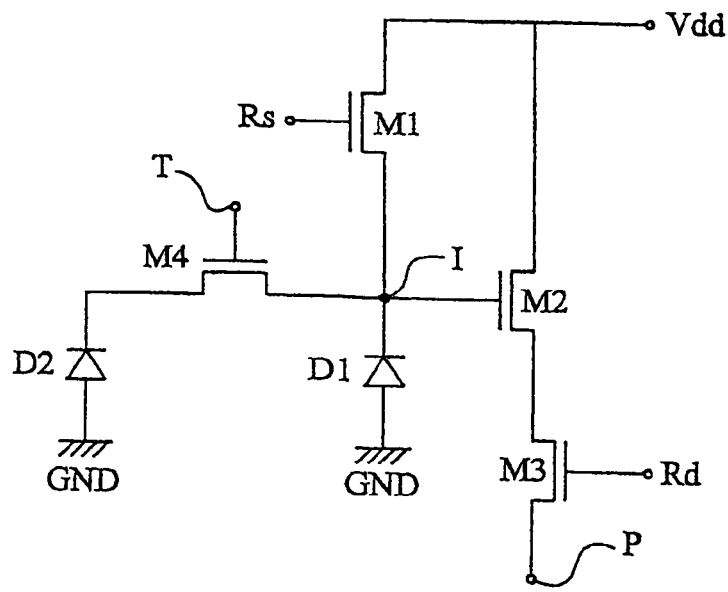
FIG. 1, previously described, shows an electric diagram of a photodetector with one photodiode of a conventional image sensor.
Figure 2:
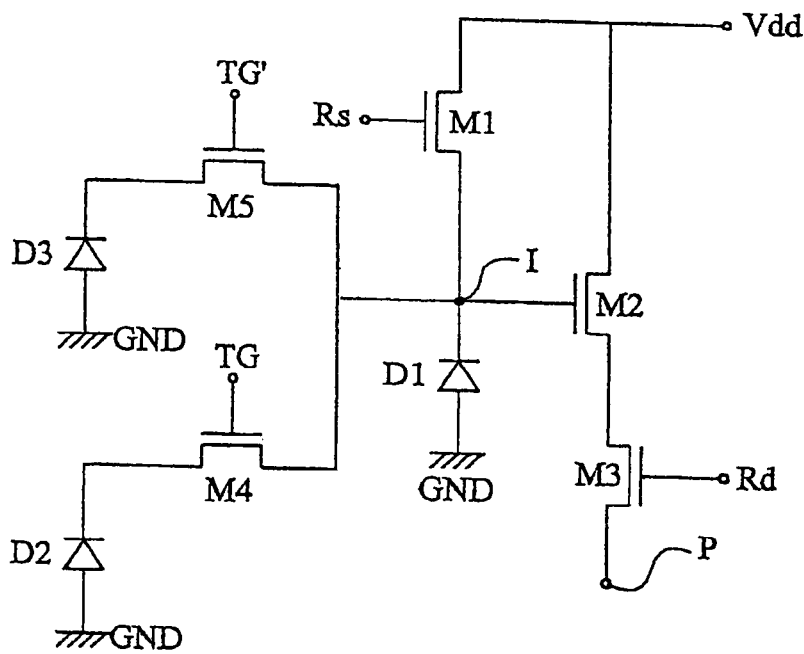
FIG. 2, previously described, shows an electric diagram of a photodetector with two photodiodes of a conventional image sensor.
Figure 3:
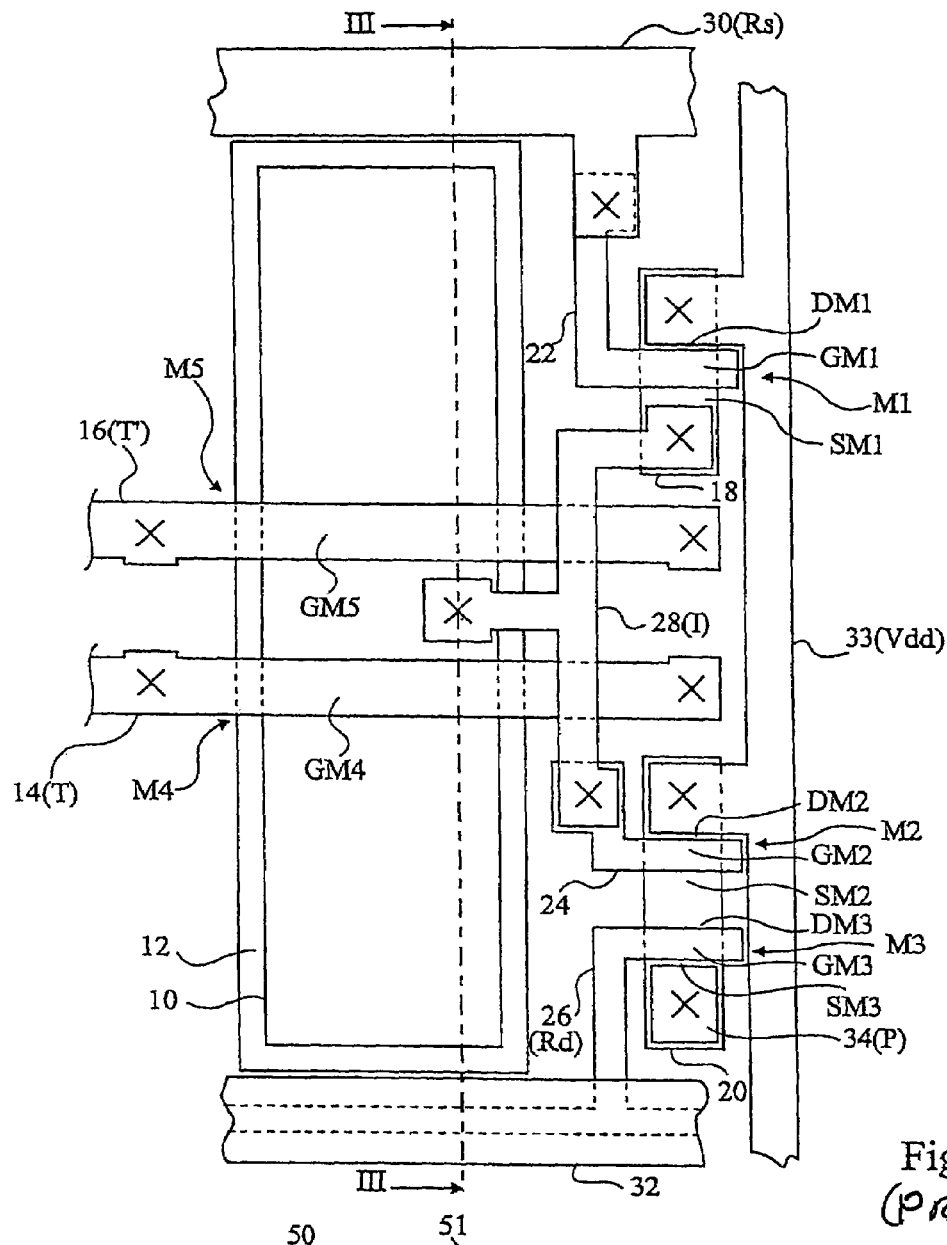
FIG. 3, previously described, shows an example of a topology of the photodetector of FIG. 2.
Figure 4:
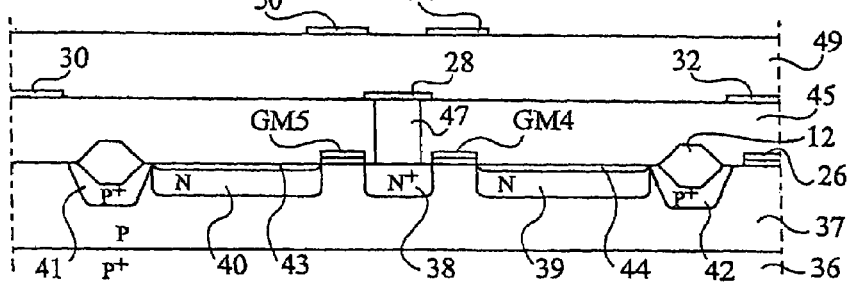
FIG. 4, previously described, shows a simplified cross-section of the photodetector of FIG. 3 along line III—III.
Figure 5:
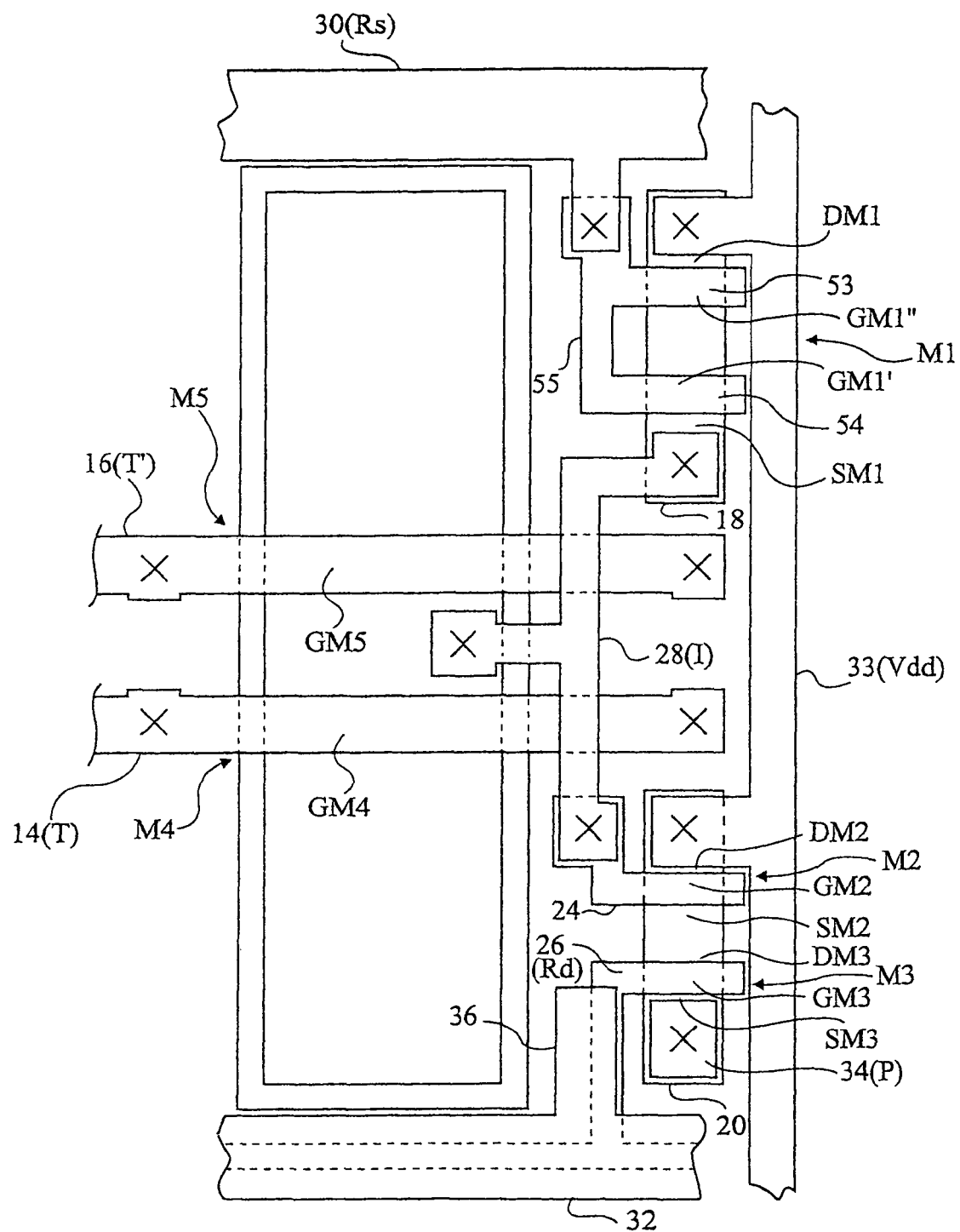
FIG. 5 shows an embodiment of a topology of a photodetector with two photodiodes according to the present invention.

In the following description, the same reference numerals are used to designate the same elements.

The principle of the present invention comprises setting the dimensions of active areas 18, 20 of recharge and read transistors M1, M2, M3 and the dimensions of associated polysilicon strips 24, 26 so that the exposed surface of active area 18 corresponding to recharge transistor M1 is substantially equal to the exposed surface of active area 20 corresponding to read transistors M2, M3 and that the exposed surface areas of the polysilicon portions associated with recharge transistor M1 are substantially equal to the sum of the exposed surface areas of polysilicon strips 24, 26 associated with read transistors M2, M3. Photon absorption and electron diffusion phenomena substantially identical above polysilicon strip 16 and under polysilicon strip 14 are thus obtained.

The present invention provides using as a precharge transistor a MOS transistor M1 comprising two parallel gates GM1', GM1", and called a dual-gate transistor. Gates GM1', GM1" of dual-gate MOS transistor M1 correspond to parallel portions 53, 54 of polysilicon strips connected to a main polysilicon portion 55 connected to metal strip 30. This enables forming an active area 18 of MOS transistor M1, the dimensions of which are substantially equal to the dimensions of active area 20 and providing exposed surface areas of polysilicon portions 53, 54, 55 substantially equal to the exposed surface areas of polysilicon strips 24, 26.

Further, metal strip 32 may comprise an extension 36 which partially covers the polysilicon strip 26 associated with MOS transistor M3 to enhance the pixel symmetry.

In the present embodiment, gates GM1', GM1" of MOS transistor M1 are both connected to metal strip 30 and thus receive the same precharge control signal Rs. It is however possible to connect gates GM1', GM1" to two different metal strips to control each gate GM1', GM1" with a specific precharge control signal.

Similarly, in the present embodiment, drains DM1, DM2 of MOS transistors M1, M2 are connected to metal strip 33 of level 3 at supply voltage Vdd. It is however possible to connect drains DM1, DM2 to distinct metal strips at different voltages.

The pixel according to the present invention being substantially symmetrical, the voltages at read node I resulting from the discharge step of photodiodes D2, D3 are substantially identical for a same light exposure. Any unwanted noise is thus suppressed or eliminated. The same amplification gain may then be used by the electronic processing system for the signals originating from the two photodiodes.

Of course, the present invention is likely to have various alterations, modifications, and improvement which will readily occur to those skilled in the art. Thus, some of the N-channel MOS transistors may be replaced with P-channel transistors. Further, the cell forming has been described as involving one polysilicon level and three metallization levels. It is quite possible to replace the metal strips of one or several metal levels with another conductive material. For example, the first metallization level may be replaced with a level two of doped polysilicon.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A monolithic photodetector comprising:
    a pixel of a pixel matrix, said pixel further comprising:
        a first active area of doped single-crystal silicon including first and second photodiodes having a same surface area, as two charge transfer MOS transistors, and as one storage diode, a cathode of each photodiode being connected to a cathode of the storage diode via one of the charge transfer MOS transistors;
        a second active area of doped single-crystal silicon arranged next to a portion of the first active area associated with the second photodiode and including a precharge switch having a first terminal connected to the cathode of the storage diode and a second terminal connected to a reference voltage; and
        a third active doped single-crystal silicon area arranged next to the portion of the first active area associated with the first photodiode and including two read MOS transistors in series, the gate of one of the read transistors being connected to the cathode of the storage diode and the drain or the source of one of the read transistors being connected to a processing system,
    wherein the surfaces of the second and third active areas exposed to a lighting are substantially identical;
    wherein the precharge switch is a MOS transistor with two parallel gates; and
    wherein the gates of the two read transistors correspond to portions of first and second polysilicon strips and wherein the two gates of the MOS transistor with two gates correspond to portions of third and fourth parallel polysilicon strips, the sum of the surface areas exposed to light of the third and fourth parallel polysilicon strips being substantially equal to the sum of the surface areas exposed to light of the first and second polysilicon strips.

2. The photodetector of claim 1, wherein the second and third active areas have substantially identical surface areas.

3. The photodetector of claim 2, wherein first, second, and third active areas are rectangular, the second and third active areas being of same dimensions and substantially aligned at a same distance from a side of the first active area.

4. The photodetector of claim 1, wherein a fifth polysilicon strip, perpendicular to the third and fourth parallel polysilicon strips, connects the third and fourth parallel strips.

5. The photodetector of claim 4, comprising a metal strip connected to the fifth polysilicon strip, said metal strip comprising an extension partially covering the second polysilicon strip.

6. The photodetector of claim 1, wherein the gates of the charge transfer MOS transistors correspond to portions of polysilicon strips which extend between the second and third active areas.

7. A monolithic photodetector comprising:
    a pixel of a pixel matrix, said pixel further comprising:
        a first active area of doped single-crystal silicon including first and second photodiodes having a same surface area as two charge transfer MOS transistors, and as one storage diode;

a second active area of doped single-crystal silicon arranged next to a portion of the first active area associated with the second photodiode and including a precharge switch; and a third active doped single crystal silicon area arranged next to the portion of the first active area associated with the first photodiode and including two read MOS transistors in series;

wherein the surfaces of the second and third active areas exposed to light are substantially identical;

wherein the precharge switch is a MOS transistor with two parallel gates; and wherein the gates of the two read transistors correspond to portions of first and second polysilicon strips and wherein the two gates of the MOS transistor with two gates correspond to portions of third and fourth parallel polysilicon strips, the sum of the surface areas exposed to light of the third and fourth parallel polysilicon strips being substantially equal to the sum of the surface areas exposed to light of the first and second polysilicon strips.

8. The photodetector of claim 7, wherein the second and third active areas have substantially identical surface areas.

9. The photodetector of claim 8, wherein first, second, and third active areas are rectangular, the second and third active areas being of same dimensions and substantially aligned at a same distance from a side of the first active area.

10. The photodetector of claim 7, wherein a fifth polysilicon strip, perpendicular to the third and fourth parallel polysilicon strips, connects the third and fourth parallel strips.

11. The photodetector of claim 10, comprising a metal strip connected to the fifth polysilicon strip, said metal strip comprising an extension partially covering the second polysilicon strip.

12. The photodetector of claim 7, wherein the gates of the charge transfer MOS transistor correspond to portions of polysilicon strips which extend between the second and third active areas.

* * * * *